(12) United States Patent
Romijn et al.

(10) Patent No.: US 8,883,539 B2
(45) Date of Patent: Nov. 11, 2014

(54) SOLAR CELL AND METHOD OF ITS MANUFACTURE

(75) Inventors: Ingrid Gerdina Romijn, Amsterdam (NL); Jan Hendrik Bultman, Alkmaar (NL); Agnes Andrea Mewe, Petten (NL); Arthur Wouter Weeber, Petten (NL); Machteld Willemijn Petronel Elisabeth Lamers, Petten (NL)

(73) Assignee: Stichting Energieonderzoek Centrum Nederland, Le Petten (NL)

( * ) Notice: Subject to any disclaimer, the term of this patent is extended or adjusted under 35 U.S.C. 154(b) by 0 days.

(21) Appl. No.: 13/697,732

(22) PCT Filed: May 10, 2011

(86) PCT No.: PCT/NL2011/050317
§ 371 (c)(1),
(2), (4) Date: Jan. 25, 2013

(87) PCT Pub. No.: WO2011/142666
PCT Pub. Date: Nov. 17, 2011

(65) Prior Publication Data
US 2013/0125976 A1 May 23, 2013

(30) Foreign Application Priority Data

May 11, 2010 (NL) ...................................... 2004698
Nov. 25, 2010 (NL) ...................................... 2005757

(51) Int. Cl.
*H01L 21/00* (2006.01)
*H01L 31/02* (2006.01)
*H01L 31/068* (2012.01)
*H01L 31/0224* (2006.01)
*H01L 31/18* (2006.01)
*H01L 21/44* (2006.01)

(52) U.S. Cl.
CPC ......... *H01L 31/02021* (2013.01); *Y02E 10/547* (2013.01); *H01L 31/0682* (2013.01); *H01L 31/02245* (2013.01); *H01L 31/18* (2013.01)
USPC ....... 438/57; 438/672; 438/675; 257/E21.585

(58) Field of Classification Search
USPC ............ 438/57, 98, 629, 637–640, 672, 675; 257/E27.122–E27.126, 257/E25.007–E25.009, E21.577, 257/E21.585–E21.586
See application file for complete search history.

(56) References Cited

U.S. PATENT DOCUMENTS

| | | |
|---|---|---|
| 3,903,427 A | 9/1975 | Pack |
| 4,610,077 A | 9/1986 | Minahan |

(Continued)

FOREIGN PATENT DOCUMENTS

| | | |
|---|---|---|
| EP | 0 528 311 | 2/1993 |
| EP | 1 703 553 | 9/2006 |
| EP | 2 068 369 | 6/2009 |

(Continued)

*Primary Examiner* — Calvin Choi
(74) *Attorney, Agent, or Firm* — Browdy and Neimark, PLLC

(57) ABSTRACT

The invention relates to a solar cell (1) comprising an emitter layer (11) at a front side (10) and a base layer (12) at the rear side (20). The solar collects first charge carriers at the front side (10) and second charge carriers at the rear side (20). The solar cell (1) further comprises at least one collecting point (14') provided at the rear side (20) and a corresponding electrical conducting path to guide the first charge carriers from the front side (10) to the at least one collecting point (14'). An insulating layer (40) is provided between at least part of the electrical conducting path and the base layer (12) to provide electrical insulation between the electrical conductive path and the base layer (12).

6 Claims, 4 Drawing Sheets

(56) References Cited

U.S. PATENT DOCUMENTS

| | | |
|---|---|---|
| 6,156,967 A | 12/2000 | Ralph |
| 2003/0022475 A1 | 1/2003 | Vieux-Rochaz |
| 2008/0009087 A1 | 1/2008 | Wada |
| 2011/0227227 A1* | 9/2011 | West ............................. 257/757 |

FOREIGN PATENT DOCUMENTS

| | | |
|---|---|---|
| WO | 89/05521 | 6/1989 |

* cited by examiner

SOLAR CELL AND METHOD OF ITS MANUFACTURE

TECHNICAL FIELD

The present invention relates to a solar cell and method of manufacturing such a solar cell. The invention specially relates to solar cells comprising collecting points at the rear side to collect charge carriers associated with the front side, such as metal wrap through solar cells, metal wrap around solar cells and emitter wrap through solar cells.

STATE OF THE ART

Figure 1A:
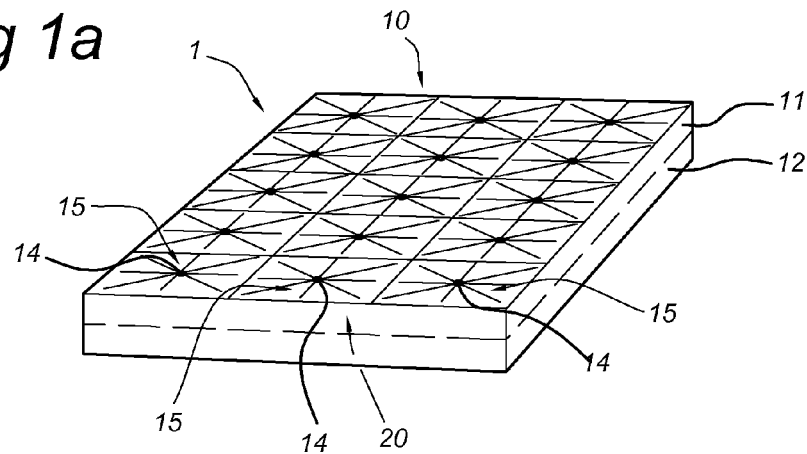

Different types of solar cells are known from the state of the art. An example of a prior art solar cell 1 is schematically shown in FIG. 1a.

Solar cells are usually formed as a plate, comprising a front side 10 and a rear side 20. During use, the front side 10 is orientated towards incoming (sun-)light. The front side 10 is arranged to collect light and to reflect as little light as possible.

The solar cell 1 comprises a semiconductor substrate as base material, positioned in between the front side 10 and rear side 20 of the solar cell 1. The semiconductor substrate may be made of silicon. Such solar cells may have a typical thickness of 50-350 μm.

The semiconductor substrate may comprise a base layer 12 of a first conductivity type and an emitter layer 11 covering the base layer on the front side of a conductivity type opposite to that of the base layer. The first conductivity type may be provided by a p-type layer, the second conductivity type may be provided an n-type layer, or vice versa. The heart of the solar cell is formed by the transition boundary between the emitter layer 11 and the base layer 12. Under the influence of light, photons and holes are created, which travel to opposite sides of the solar cell 1, i.e. the front and rear side 10, 20 of the solar cell 1.

To collect the charge from the front side 10 and the rear side 20, conducting elements 15, 24 may be provided on the front and rear side, to enable transportation of the charges. The conducting elements 15, 24 may be formed by a suitable conductive material, such as silver, aluminium, copper, conducting oxides like $TiO_x$ or organics. The conducting elements 15, 24 may be formed in any suitable pattern.

Especially the pattern of conducting elements 15 on the front side 10 may be carefully designed as to provide optimal balance between a dense pattern for facilitating easy transportation of charges and a non-dense pattern as to minimize the shadow-effect of the conducting elements 15 on the solar cell 1.

FIG. 1a schematically shows an example of such a pattern. A further example of a possible pattern is described in "The Starfire project: towards in-line mass production of thin high efficiency back-contacted multicrystalline silicon solar cells", by M. N. van den Donker, 23rd European Photovoltaic Solar Energy Conference, 1-5 September 2008, Valencia, Spain.

The pattern of conducting elements 24 provided at the rear side 20 may be formed in different ways. For instance, the pattern of conducting elements 24 provided at the rear side 20 may be provided as an integral conducting layer, covering most of the rear side 20 area, which may be referred to as a solar cell 1 with full rear metallization.

The patterns of conducting elements 15 positioned at the front side 10 may comprise collecting points 14, wherein the charge carriers may be collected.

A number of solar cells 1 may be used to form a solar panel. FIG. 1a shows a solar cell. The different solar cells 1 are electrically connected in series forming a so-called string. By using a connection strip (also referred to as tab), the pattern on the front side 10 may be connected to the pattern at the rear side 20 of an adjacent solar cell, by connecting the conducting elements 15 on the front side to the conducting elements on the rear side 20 of an adjacent solar cell 1.

In order to reduce shadowing effects at the front side 10, different types of solar cells are known in the state of the art in which the collecting points associated with the front side generated charge carriers are provided on the rear side. The solar cell comprises an electrical conducting path between the front side 10 and at least one collecting point provided on the rear side, providing an electrical connection between the front side 10 and the rear side 20 to guide the first charge carriers from the front side 10 to the at least one collecting point 14' provided at the rear side 20. Different variants of such solar cells are known, such as metal wrap through solar cells, metal wrap around solar cells and emitter wrap through solar cells.

An example of a metal wrap through solar cell is provided below with reference to FIGS. 1b and 1c.

Figure 1B:
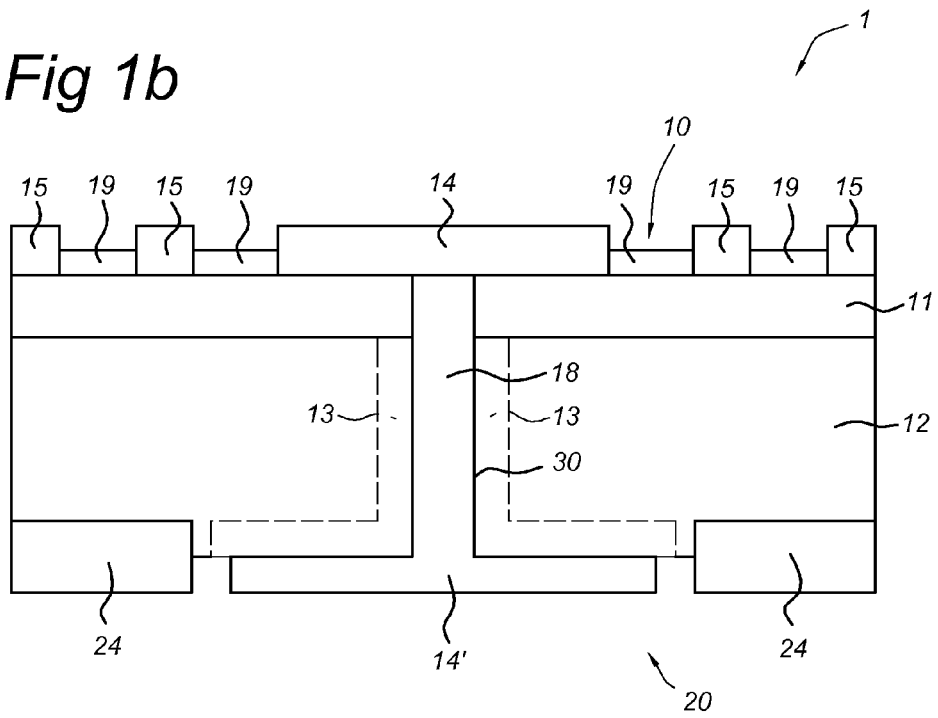

FIG. 1b schematically shows a cross sectional view of a metal wrap through solar cell 1 with full rear metallization, according to the state of the art.

In metal wrap through solar cells, the collecting points 14 of the front side 10 are guided to the rear side 20. A hole or via 30 is formed in the solar cell 1 from front side 10 to rear side 20, providing the electrical conducting path, allowing collecting points 14' to be formed on the rear side 20. The collecting points 14' are electrically connected with the pattern of conducting elements 15 on the front side 10 via the electrical conducting path provided by the via 30.

The via 30 may be formed in any suitable way, for instance using a laser to drill the via's.

As a result, there is no more need to have tabs on the front side 10 of the solar cell 1. The solar cells may be electrically connected to each other by using connection strips (tabs) provided on the rear side. The connecting strips may also be formed by conducting foils.

In between the conducting elements 15 on the front side 10 a passivating and anti reflection coating 19 may be provided, as is shown in FIG. 1b.

The via 30 may be filled with a conductive material 18, such as a metal paste or an alternative conducting material, forming an electrical conducting path from the front side 10 to the rear side 20. The metal may be sintered metal.

At the interior wall of the via 30 an interface layer 13 may be formed of emitter material, i.e. having a doping level which is comparable, lower or higher compared to the doping level of emitter layer 11. The interface layer 13 is indicated in FIG. 1b by the dotted line.

Figure 1C:
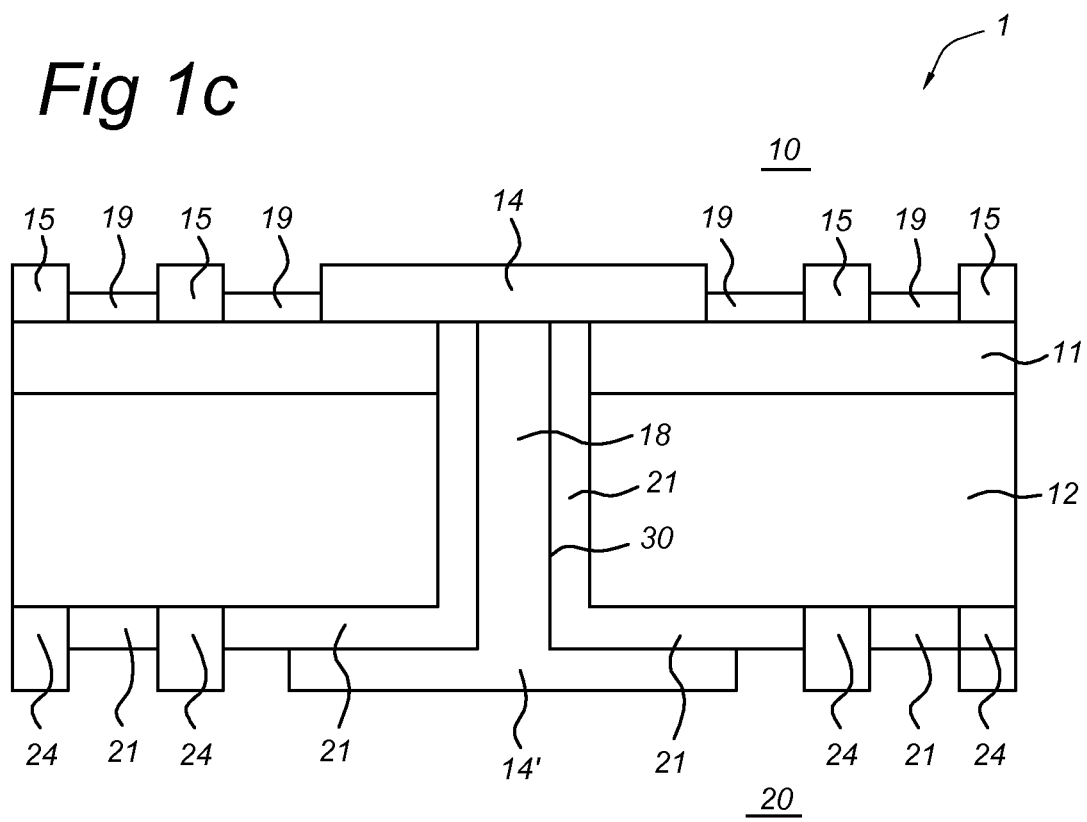

FIG. 1c schematically shows a cross sectional view of an alternative solar cell as known in the prior art, i.e. a metal wrap through solar cell 1 with dielectric (or other, for instance amorphous Si or Silicon Carbide ($SiC_x$)) passivation and open rear metallization. This solar cell 1 is similar to the solar cell 1 described above with reference to FIG. 1b, except for the fact that the rear side 20 is not fully metalized. Furthermore, in between the pattern of conducting elements 24 on the rear side 20 a rear surface dielectric passivation layer 21 is provided, that can also extend along the interior wall of the via 30. In fact, the rear surface dielectric passivation layer 21 may be formed by a stack of different layers. This can be for instance a $SiO_x/SiN_x$ stack or an $AlO_x/SiN_x$ stack.

Above, two types of metal wrap through solar cells 1 were described with reference to FIGS. 1b-1c. However, it will be understood that alternative solar cells 1 are known and conceivable, such as metal wrap around and emitter wrap through solar cells. Depending on the type of solar cell 1, for instance with full aluminium rear surface for p-type base material (an example of which is shown in FIG. 1b) or bifacial with a passivated (by dielectric layer) rear surface for both p- and n-type base material (an example of which is shown in FIG. 1c), the electrical conductive path from front side 10 to rear side 20 (e.g. conductive material 18 in the via 30) and the collecting points 14' at the rear side 20 are in contact with the emitter layer 11 and the interface layer 13 or are in contact with the dielectric passivation layer 21.

Inside the electrical conducting paths from front side 10 to rear side 20, the emitter current is conducted from the front side 10 to rear side 20, for instance via a metal paste. However, during use, part of the emitter current may leak to the base layer 12. This effect is called shunting, the term shunting used in this text as also referring to non-linear shunting. This effect decreases the efficiency and stability of the solar cell 1. The electrical shunts decrease the fill factor (FF) and thereby the efficiency ($V_{oc}*J_{sc}*FF$) of the solar cells.

The term fill factor is known to the skilled person. It provides a definition of the overall behaviour of a solar cell, i.e. the ratio of the maximum power point divided by the open circuit voltage ($V_{oc}$) and the short circuit current ($I_{sc}$): $FF=P_m/(V_{oc} \cdot I_{sc})$.

As a result of this problem, the fill factor of solar cells 1 comprising collecting points at the rear side to collect charge carriers associated with the front side is relatively low. Besides metal wrap through solar cells, also other types of solar cells are known from the prior art, which suffer from electrical shunts. Examples of such other solar cells are so-called metal wrap around (MWA) solar cells and emitter wrap through (EWT) solar cells. In these solar cells, the emitter current is also transported to the rear side 20 using an electrical conducting path between the front side and the at least one collecting point provided on the rear side, introducing the risk of shunting.

In a metal wrap around solar cell, the electrical conducting path is provided along side edges of the solar cell. In an emitter wrap through solar cell the electrical conducting path is provided by emitter material and/or a metal, running through the base layer towards the rear side 20. In all these alternative solar cells, the electrical conducting path is in contact with the base layer and the emitter current may leak to the base layer, in other words, shunting may occur.

Solar cells 1 as described here are for instance described in
P. C. de Jong et al., Conference proceedings 19th EPVSEC, Paris, France (2004)
A. W. Weeber et al., Conference proceedings 21st EPVSEC, Dresden, Germany (2006)
F. Clement et al., Conference proceedings 22nd EPVSEC, Milano, Italy (2007)
A. Mewe et al., Conference proceedings 23rd EPVSEC, Valencia, Spain (2008).

SHORT DESCRIPTION

It is an object of the present invention to provide a solar cell and method of fabricating such a solar cell that provides an increased fill factor.

According to an aspect there is provided a solar cell as defined in claim 1.

By providing an insulation layer 40 more efficient solar cells 1 are provided. The insulation layer 40 decreases losses in efficiency caused by shunting solar cells 1. The risk of electrical shunts is reduced and the electrical conducting path will no longer form a limiting factor for the output of the solar cell 1.

Furthermore, the possibility is created to process different types of solar cells 1 such as: metal wrap through solar cells with shallow or selective emitter, metal wrap through solar cells with a rear dielectric passivating layer, or n-type metal wrap through solar cells.

The improved solar cells allow industrialization of specific, new types of solar cells that are not yet ready for industrialization as these solar cells were not yet sufficiently efficient. This may for instance apply to metal wrap through solar cells using selective emitters or rear surface passivation, or to metal wrap through solar cells where the p-n junction is isolated using a wet chemical etch removing the emitter on the rear side. In these cells the emitter inside the vias will be shallow or even absent.

According to an aspect there is provided a method of manufacturing a solar cell as defined in claim 13.

Further aspects of the invention are described in the dependent claims.

SHORT DESCRIPTION OF THE DRAWINGS

Figure 2A:
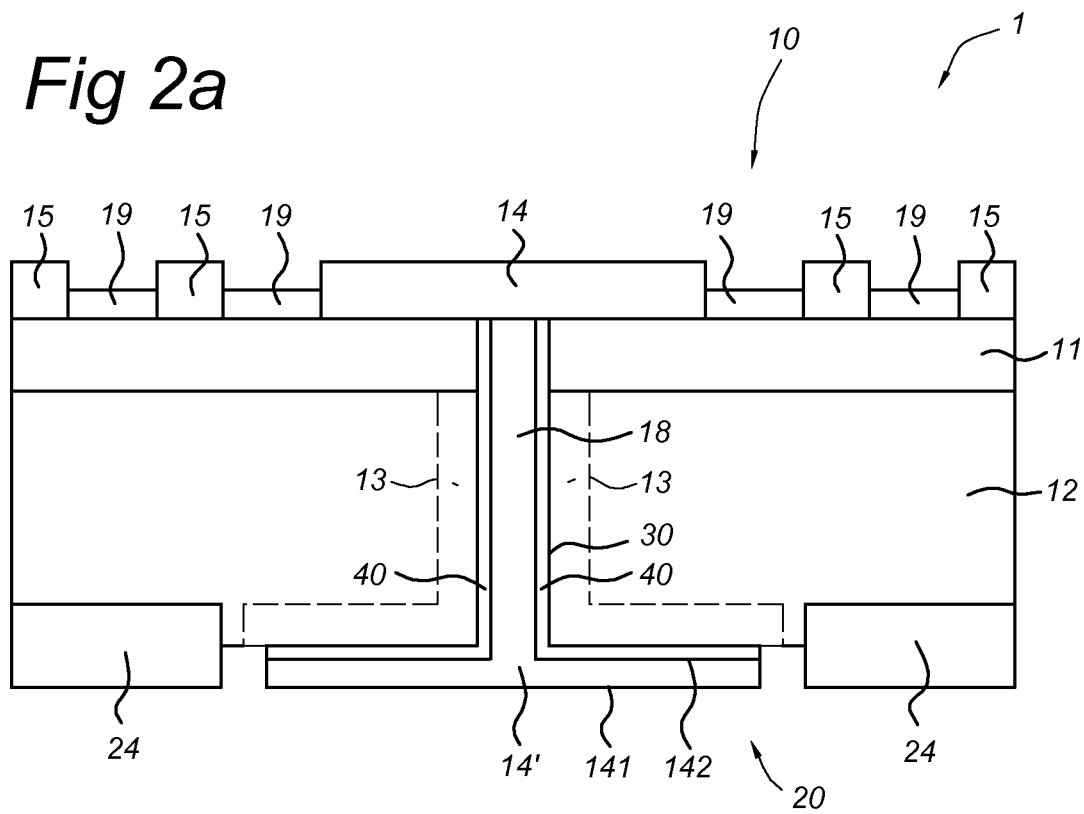
Figure 2B:
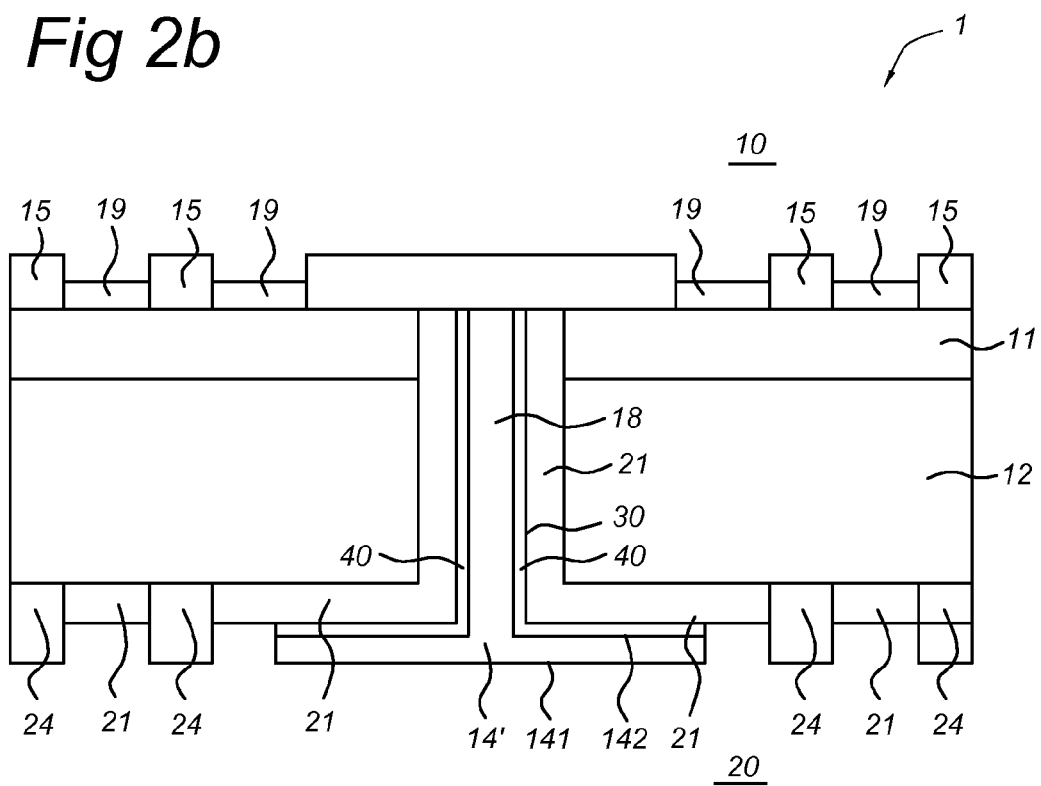
Figure 3:
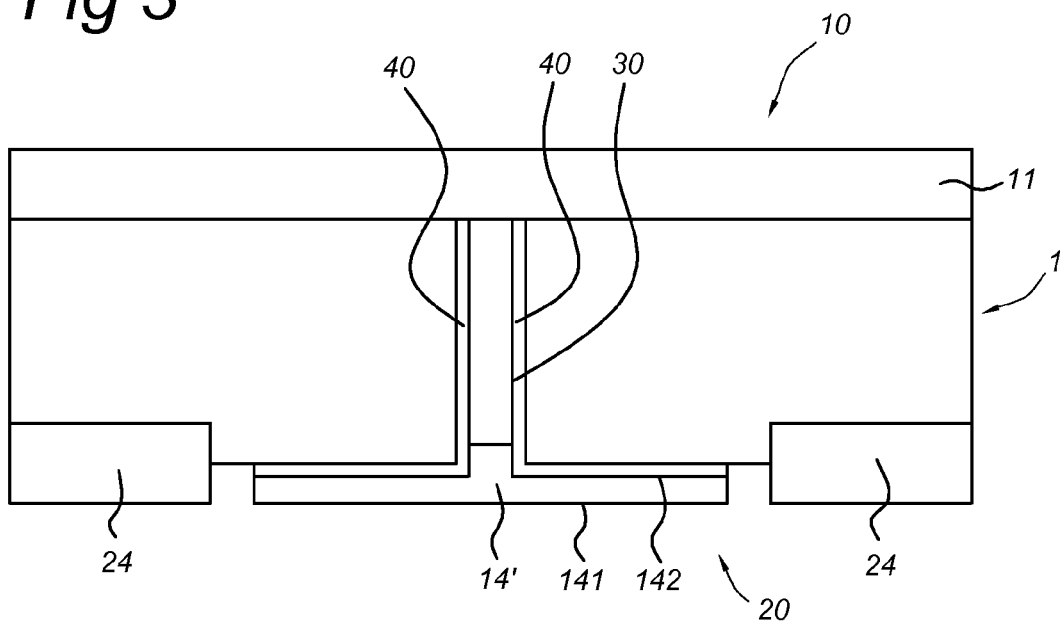
Figure 4:
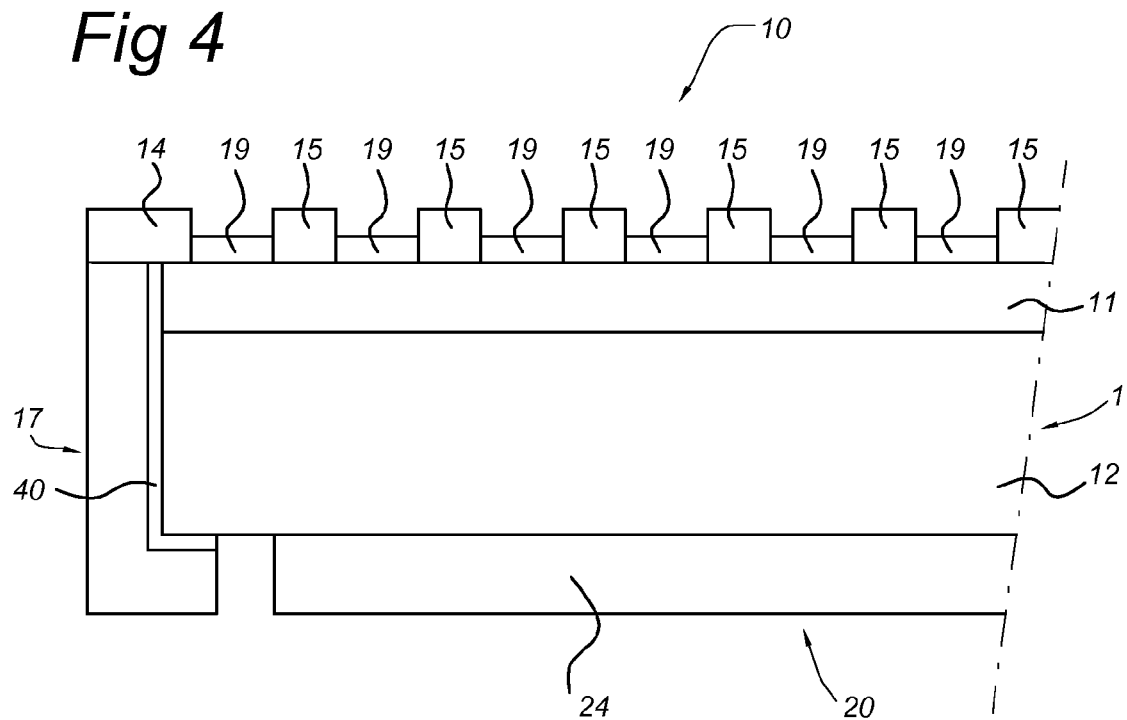

Embodiments of the invention will now be described, by way of example only, with reference to the accompanying schematic drawings in which corresponding reference symbols indicate corresponding parts, but are not used to limit the scope of the invention, and in which:

FIGS. 1a-c schematically depict solar cells according to the state of the art;

FIGS. 2a-b schematically depict solar cells according to different embodiments;

FIGS. 3 and 4 schematically depict solar cells according to further embodiments.

DETAILED DESCRIPTION

The embodiments described below show solar cells 1 of different types, such as metal wrap through solar cells, metal wrap around solar cells and emitter wrap through solar cells.

FIGS. 2a and 2b depict embodiments of a metal wrap through solar cell, comprising an electrical conducting path between the front side 10 and the rear side 20, which is formed by a via 30 which is provided with an insulating layer 40 on the interface between conductive material 18 provided inside the via 30 and the silicon substrate forming the solar cell 1. In case the conductive material 18 is a metal paste, the insulating layer 40 may be formed by an annealing treatment forming an insulating metal oxide layer on the outside of the conductive material 18. The insulating layer 40 may also be formed in another way and may be formed of a different material, as will be described in more detail below.

In general, the solar cell 1 is formed of a layer of semiconductive material, such as silicon, provided in between a front side 10 and a rear side 20 of the solar cell. The solar cell comprises an emitter layer 11 at the front side 10 and a base layer 12 at the rear side 20.

The front side 10 with the emitter layer 11 is in use directed to a light source, such as the sun or for instance a reflector, reflecting sun light. In use, first charge carriers will gather at the front side 10 and second charge carriers of an opposite type as the first charge carriers gather at the rear side 20.

An electrical conducting path may be provided to carry first charge carriers collected by the emitter layer 11 to the rear side 20 of the solar cell. The electrical conducting path may be provided by a via 30 provided through the emitter layer 11 and the base layer 12, wherein the via 30 is filled with a conductive material 18 providing an electrical connection between the front side 10 to the rear side 20 to guide the first charge carriers from the front side 10 to collecting points 14' provided at the rear side 20. This is a so-called metal wrap through solar cell which is described in more detail below with reference to FIGS. 2a and 2b.

The electrical conducting path may electrically connect the conducting elements 15 on the front side 10 of the solar cell to collecting points 14' at the rear side 20 of the solar cell 1.

Alternative solar cells, like emitter wrap through solar cells and metal wrap around solar cells are shown in FIGS. 3 and 4, in which same reference numbers are used to refer to similar elements.

FIG. 3 shows an emitter wrap through solar cell wherein the electrical conducting path is formed by emitter material. The electrical conducting path extends through the base layer 12 and is at least partially filled with emitter material. The other part may be filled with metal or the like, integrally formed with the collecting point 14'.

These types of solar cells 1 have an emitter layer 11 on the front side 10, but have no emitter metallization, i.e. no conducting elements 15 on the front side. A via 30 is formed through the base layer 12 formed as an extension of the emitter layer 11, thus formed by emitter material. The collecting point 14' to collect the first charge carriers is formed on the rear side 20 and is in contact with the emitter material extending through the base layer 12. The collecting point 14' may be made of a conducting material, like metal and may extend in to the via 30 to some extent, meeting the emitter material.

FIG. 4 shows a metal wrap around solar cell, wherein the electrical conducting path is formed by a conductive material provided along at least one side edge 17 of the solar cell. So, instead of having an electrical conducting path extending through the base material 12, the electrical conducting path is formed around the base layer 12. In the prior art, the electrical conducting path was in contact with the base layer 12 introducing the risk of shunting, i.e. leaking of emitter current to the base layer 12. Thus, as shown in FIG. 4, the insulating layer 40 is provided in between the electrical conducting path and the base layer 12 to provide insulation between the conductive material and the base layer 12. Examples of insulating material are SiOx, SiNx and AlOx.

According to the embodiments, shunting is prevented or at least reduced, by providing an insulating layer 40 at least along part of the electrical conducting path provided to transport first charge carriers collected at the front side 10 to collecting points 14' provided at the rear side 20. The insulation layer 40 provides insulation between the electrical conducting path and the base layer 12.

The insulating layer 40 may be formed of a dielectric material, such as silicon nitride. In general the term insulating layer 40 is used to refer to a material that resists the flow of electric current.

In general, the insulating layer 40 has a resistivity that is substantially higher than the surrounding materials, such as the material forming the electrical conducting path (e.g. the conductive material 18 provided inside the via 30), the emitter layer 11 and the base layer 12. The insulating layer 40 may have a resistivity that is at least a factor 10 or 100 higher than the surrounding materials.

The insulating layer 40 may for instance be made of $SiO_2$ having a resistivity in the range of $10^{14}$-$10^{16}$ $\Omega m$, $Al_2O_3$ having a resistivity of approximately $10^{11}$ $\Omega m$, $Si_3N_4$ having a resistivity of approximately $10^{14}$ $\Omega m$, $TiO_2$ having a resistivity of $10^{14}$ $\Omega m$, $ZrO_2$ having a resistivity of approximately $10^{10}$ $\Omega m$. The insulating layer may also be made of $Bi_2O_3$, PbO, ZnO, $SnO_2$, $B_2O_3$ CdO, or $P_2O_5$. The insulating layer may also be made of a combination of oxide layers.

The deposition (or other for instance oxidation) techniques used will not form perfect crystal structures. The deposition or oxidation techniques may also result in amorphous material or oxide compounds, or more complex silicates. So, more generally for instance $SiO_x$, $AlO_x$, $SiN_x$, $TiO_x$, $ZrO_x$, $BiO_x$, $ZnO_x$, $SnO_x$, $BO_x$, $CdO_x$, or $PO_x$ and/or $PbO_x$ layers may be formed of which the resistivity may vary and may be lower than the values indicated in the paragraph above. In general, the insulating layer may formed of a material having a resistivity >$10^5$ $\Omega m$.

The insulating layer 40 may have any suitable thickness. A typical thickness may be in the range of 1-10 nm.

The embodiments presented here may be applied to all types of solar cells 1, having an electrical conductive path to transport first charge carriers to collecting points 14' at the rear side 20, for instance with a full aluminium rear surface or with a rear side passivating coating. Also, the embodiments may be applied to solar cells of which the base material, i.e. the base layer 12 is made of either p-type or n-type base material. Now, two embodiments will be described in more detail with reference to FIGS. 2a and 2b.

FIGS. 2a and 2b schematically depict embodiments corresponding to the state of the art examples described above with reference to FIGS. 1b and 1c respectively.

FIG. 2a schematically depicts a metal wrap through solar cell 1 with full aluminium rear surface. This type of solar cell 1 is discussed in more detail above with reference to FIG. 1b. In this embodiment, an insulating layer 40 is formed. As shown, the insulating layer 40 is formed from the conductive material 18 forming the electrical conducting path between the front side 10 and collecting points 14' at the rear side. Interface layer 13 may still be present, but may also be absent, depending on the manufacturing process used.

As will be described in more detail below, the insulating layer 40 may be formed from the conductive material 18, for instance in case the conductive material is a metal, the insulating layer 40 may be formed by performing a high temperature annealing action as part of the manufacturing method.

The conductive material 18 may comprise a main conductive component, for instance a metal like Al or Ag, for collecting and transporting charge carriers. The conductive material 18 may further comprise an oxide containing compound, like Bi-oxide, Pb-oxide, Zr-oxide and/or Ti-oxide, or another metal-oxide such as named above. The high temperature annealing action may be a short and relatively high temperature annealing action, as will be described in more detail below. This annealing action may be the same step in which the front and rear side contacts 15 and 24 are formed. The annealing action will have the effect that the oxide containing compounds form the insulating layer 40 at the outside of the via 30.

FIG. 2b schematically depicts a metal wrap through solar cell 1, which is bifacial with a passivated (by dielectric layer) rear surface and a pattern of conducting elements 24. Similar as to FIG. 2a, an insulating layer 40 is formed.

The insulating layer 40 may be formed in any suitable way. This applies to all types of solar cells having an electrical conducting path to carry first charge carriers collected at the front side (i.e. formed in the emitter layer) to collecting points 14' at the rear side 20.

The insulating layer 40 may for instance consist of an oxide layer. The oxide layer may be formed in the manufacturing process as will be explained in more detail below. Providing an oxide layer is an efficient way of providing an insulating layer 40, which can be obtained by performing an oxidation action in which one of the materials already present is oxidized to form an insulating layer. As a result, no additional material is required.

The insulating layer 40 may be formed by a metal oxide layer. The metal oxide layer may be formed by performing an oxidizing action, such as a high temperature annealing action causing the metal conductive material 18 provided in the via 30 to oxidize on the outside. The metal oxide layer may also be or comprise an aluminium-oxide layer.

The annealing action may also cause the oxide containing compound present in the conductive material 18 to form the insulating layer 40 at the outside of the via 30. Examples of such insulating layers 40 that may be formed during the annealing step are $SiO_x$, $AlO_x$, $ZrO_x$, $PbO_x$, $TiO_x$, $BiO_x$, $ZnO_x$, $SnO_x$, $BO_x$, $CdO_x$, or $PO_x$ and/or $PbO_x$ or a combination of these oxides. Examples of these are provided in FIGS. 2a and 2b. The annealing temperature may be between 300 and 1000° C. and spike for 0.1 to 1000 seconds or the annealing temperature may be between 600 and 900° C. and spike for 1 to 30 seconds. The annealing step may be the same step as the standard 'firing' step (having a 'standard temperature profile', as it is known in the solar cell manufacturing to a skilled person), to contact the electrical conducting paths 15 and 24 to collect the charge carriers.

The insulating layer 40 may be a dielectric layer. The insulating layer 40 may alternatively be formed by one of a silicon oxide layer and a silicon-nitride layer. In these cases, the oxide layer is not formed from the conductive material, but is formed from the silicon material forming the emitter layer 11 and the base layer 12. The insulating layer can also be any other dielectric layer like silicon carbide.

The silicon oxide layer may be formed by performing an oxidizing action causing the silicon material facing the electrical conductive path to oxidize and thereby forming an insulating layer 40. This may be the material facing the inside of the via 30 or the material forming the side edge 17 of the solar cell.

The oxidizing action may comprise a wet chemical oxidizing action or may comprise a thermal oxidizing action. Alternatively, the oxidizing action may comprise deposition of a $SiO_x$-layer, for instance by means of PECVD (plasma enhanced chemical vapour deposition).

According to an embodiment the insulation layer 40 is provided to prevent direct physical and electrical contact between the electrical conducting path, i.e. the conductive material 18 inside the via 30, and the base layer 12. The insulation layer 40 may cover the complete outside of the conductive material 18 that faces the base layer 12 along the entire inner surface of the via 30.

The electrical conducting path may be formed as an elongated part extending through the emitter layer 11 and the base layer 12 towards a collecting point 14' provided on the rear side 20. The collecting point 14' may have a contacting area 141 facing away from the solar cell 1 and a rear area 142 facing the base layer 12. The insulation layer 40 may be provided along the elongated part of the electrical conducting path. The insulation layer 40 may also be provided on the rear area 142 of the collecting point 14', i.e. between the rear area 142 and the base layer, to prevent direct physical contact between the collecting point 14' and the base layer 12, thereby reducing shunts between the collecting point 14' and the base layer 12. Thus, the insulating layer 40 may also extend to the rear side of the solar cell.

The collecting point 14' may have dimensions in a direction parallel to the front and rear side 10, 20 that are substantially larger than the dimension of the electrical conducting path extending through the base layer 12, e.g. inside the via 30, in that same direction. The collecting point 14' may be used to be electrically connected to a connection strip or tab.

The elongated part of the electrical conducting path, e.g. the conductive material 18 inside the via, and the collecting point 14' may be formed as one piece, but may also be formed as two elements.

In the embodiments depicted in FIGS. 2a and 2b, the insulating layer 40 extends along the entire length of the via 30, i.e. is also present in the emitter layer 11. It will be understood that shunting will only occur with respect to the base layer 12, so embodiments may be provided in which the insulating layer 40 is only present between the conductive material 18 and the base layer 12. This can be both inside the via 30, and on the rear area 142 of the collecting point 14'.

However, as will become clear from the explanation of the embodiments for manufacturing solar cells as presented here, for at least some methods of manufacturing, the insulation layer 40 will inherently also be present inside the emitter layer.

The solar cells 1 according to the embodiments provided above may be used to form a solar panel, the solar panel comprising two or more of such solar cells 1.

Method of Manufacturing

According to a further embodiment there is provided a method of manufacturing a solar cell 1 comprising an insulating layer 40 as described above.

A method of manufacturing a solar cell may comprise one or more of the following actions:

providing a semiconductor substrate, the semiconductor substrate having a front side 10 and a rear side 20, applying a surface roughening (texturing) on the front side 10 to increase the light entrapment, forming an emitter layer 11 on the front side 10 of the semiconductor substrate with a conductivity of a first type and a base layer 12 having a conductivity of the second type, opposite to the conductivity of the first type, forming collecting points 14' at the rear side, forming an electrical conducting path between the front side 10 and the collecting points 14' at the rear side 20.

For a metal wrap through solar cell the method may comprise:

forming at least one via 30 from the front side 10 to the back side 20 through the semiconductor substrate to form the electrical conducting path, providing a conductive material 18 inside the via 30.

For an emitter wrap through solar cell the method may comprise:

forming at least one via 30 from the front side 10 to the back side 20 through the semiconductor substrate, at least the base layer 12, to form the electrical conducting path, the via comprising emitter material and possible metal material.

For a metal wrap around solar cell the method may comprise:

forming the electrical conducting path around a side edge 17 of the semiconductor substrate to form the electrical conducting path, the via comprising emitter material.

The method further comprises forming an insulating layer 40 at least along part of the electrical conducting path to provide insulation between the electrical conductive path and the base layer 12.

It is emphasized that the order of these actions may be different as mentioned here, as will be understood by a skilled person.

The formation of the emitter layer 11 and the base layer 12 may be done in any suitable way, as will be understood by the skilled person. For instance, the emitter layer may be formed on the semiconductor substrate by providing a diffusion source layer on the front side 10 of the semiconductor substrate and subsequently performing a diffusion action forming the emitter.

The base layer may be of the p-type or of the n-type, the emitter being of the opposite type.

According to an embodiment forming of an insulating layer 40 may comprise performing an oxidation action. The oxidation action may be a (high temperature) annealing action.

According to an embodiment, the oxidation action may be applied to the electrical conducting path, e.g. the conductive material 18. So, in case the conductive material is formed by a metal, the oxidation action may be performed by oxidizing the outer layers of the electrical conducting path, e.g. the conductive material 18 after it has been provided inside the via 30, thereby forming a metal oxide layer.

According to an alternative, the conductive material may comprise oxide containing compounds, like Bi-oxide, Pb-oxide, Al-oxide, Zr-oxide and/or Ti-oxide, which form the insulating layer 40 at the outside of the via 30 as a result of a (high temperature) annealing action. Examples of such oxides are $ZrO_2$, $Bi_2O_3$, $TiO_2$, $Al_2O_3$, $Bi_2O_3$, PbO, ZnO, $SnO_2$, $B_2O_3$ CdO, or $P_2O_5$ or oxides with a slightly different compositions or combinations of these oxides.

The conductive material may comprise a conductive compound, like Al of Ag. Of course, other suitable conductive compounds may be used as well. The conductive material may further comprise a small quantity of oxide containing compounds, such as $BiO_x$, $ZrO_x$, $AlO_x$, $PbO_x$ and/or $TiO_x$, for instance in the range of 0.1-10% w/w (mass percentage).

The insulating layer may be formed during a relatively high temperature, short annealing action. The annealing temperature may be between 300 and 1000° C., preferably between 300 and 500° C. and spike for 1 to 1000 seconds or from 700 and 900° C., and spike for 0.1 to 5 seconds. The annealing step may be the same step as the standard 'firing' step (having a 'standard temperature profile', as it is known in the solar cell manufacturing), to contact the electrical conducting paths 15 and 24 to collect the charge carriers.

According to an alternative embodiment the oxidation action may be applied to the semiconductor substrate facing the electrical conducting path, e.g. facing the walls of the via 30 or forming side edges 17. By doing this, a oxide layer may be formed, for instance a silicon oxide layer. This may be done before adding the electrical conducting path, e.g. before adding conductive material 18 (e.g. metal paste).

In general, the oxidation action of the semiconductor substrate may comprise a wet chemical oxidizing action or may comprise a thermal oxidizing action.

According to a further embodiment forming an insulating layer 40 may comprise deposition of an insulating layer 40, such as deposition of a $SiO_x$-layer, for instance by means of PECVD (plasma enhanced chemical vapour deposition), atomic layer deposition (ALD) or sputtering. The insulating layer 40 may be deposited on the parts of the semiconductor substrate facing the electrical conducting path, e.g. facing the walls of the via 30 or forming side edges 17. In case a via 30 is formed, this may be done after the via 30 has been formed, before the electrical conducting path is provided, e.g. before conductive material 18 is provided. Alternatively, the insulating layer 40 may be a silicon nitride layer, or an aluminium-oxide layer.

In a further embodiment, the method comprises a formation of the via 30 by a process that induces relatively low damage to the material surrounding the via to be formed. In an example, such a process may comprise low power laser drilling, but is not limited thereto.

First, in the processing sequence, the emitter layer is formed on at least the front side. If needed the emitter layer is removed from the rear side. Next, a hole is created by drilling through the semiconductor substrate, for example by means of a laser beam.

The substrate may include the emitter, back surface field, anti-reflection and/or passivating coating on front and rear side.

The hole forms a precursor for the electrical conducting path. In a subsequent process, the insulating layer 40 is arranged on at least the wall of the hole and conductive material 18 to create the electrical conducting path is applied in the hole. In a further embodiment, the insulating wall may extend over a portion of the rear surface.

Advantageously, this embodiment provides the freedom to perform the step of creating the via at any time before metallization, thus after emitter formation and subsequent rear emitter removal. In this case, shunting due to the absence of the emitter is prevented by the insulating layer. Costs and performance of the cells will benefit compared to laser isolation.

In the exemplary case that the hole is created by means of laser drilling, the laser apparatus that generates the laser beam, is set to produce a laser beam with relatively low power so as to reduce the generation of laser induced damage to the substrate material around the hole. Advantageously, in this case, if the power of the laser is reduced, the risk of fracturing the substrate during drilling is strongly reduced.

Moreover, since the laser damage of the substrate material is reduced, an etching step of the walls of the hole can be omitted and the costs of manufacturing are reduced as well.

Thus, in an embodiment the method provides that forming the at least one electrical conducting path comprises removing material from the semiconductor substrate to create a hole along which the electrical conducting path is to be formed, wherein the forming of the insulating layer follows the creation of the hole without an intermediate step of etching the walls of the hole.

In a further embodiment, the removing of material from the semiconductor substrate comprises laser-drilling the hole at the location of the via to be formed.

The method may further comprise further processing the semiconductor substrate to a solar cell. These further actions will be known to a person skilled in the art. The further processing actions may comprise:

providing the anti reflective and passivating coating(s) 19 on the front side 10, providing the back surface field and/or passivating coating (s) 21 on the rear side 20, in case of a metal wrap through solar cell or a metal wrap around solar cell, providing conducting electrodes 15 on the front side 10, providing conducting elements on the rear side 20, applying an annealing step to form electrical contact from the electrodes to the emitter and base material, if necessary provide a p-n-junction isolation.

The descriptions above are intended to be illustrative, not limiting. Thus, it will be apparent to one skilled in the art that modifications may be made to the invention as described without departing from its scope as defined by the claims set out below, and their technical equivalences.

The invention claimed is:

1. A method of manufacturing a solar cell, comprising:
   (a) providing a semiconductor substrate comprising
       (i) a front side (10)
       (ii) a rear side (20), and
       (iii) a base layer (12) at the rear side (20);
   (b) forming an emitter layer (11) on the front side (10) of the semiconductor substrate,
   (c) forming at least one electrical conducting path from the front side (10) to a corresponding collecting point (14') at the rear side (20), which electrical conducting path is in the form of a conductive material in the path which material comprises a conductive compound and an oxide-containing compound or silicate, and
   (d) forming an insulating layer (40) at the outside of the electrical conducting path to provide insulation between the electrical conducting path and the base layer (12), wherein forming the insulating layer (40) comprises performing
       (i) an annealing process on the electrical conducting path, and
       (ii) during or after the annealing, an oxidation of the conductive material forming an oxide layer on the conductive material.

2. The method according to claim 1, wherein:
   the electrical conducting path is a via (30) extending at least through the base layer (12), and
   in said forming step (d) the insulating layer (40) is formed around at least part of the via (30) to provide insulation between the via (30) and the base layer (12).

3. The method according to claim 1, wherein step (c) comprises forming the at least one electrical conducting path along a side edge (17) of the solar cell (1), wherein the insulating layer (40) is located between the electrical conducting path and the base layer (12) to provide insulation between the conductive material and the base layer (12).

4. The method according to claim 1, wherein the annealing of step (d) is performed at an annealing temperature in the range of 300° C. to 1000° C., over a time period in the range of 0.1 to 1000 seconds.

5. The method according to claim 1, wherein step (c) comprises a process that removes material from the semiconductor substrate to create a hole along which the electrical conducting path is to be formed, wherein after creating the hole, the insulating layer is formed without an intermediate step of etching walls of the hole.

6. The method according to claim 5, wherein the removing process comprises laser-drilling to create the hole at the location at which the via is to be formed.

* * * * *